United States Patent [19]

Killian

[11] Patent Number: 5,502,751

[45] Date of Patent: Mar. 26, 1996

[54] DIGITAL PHASE LOCKED LOOP

[75] Inventor: Maverick M. Killian, Ft. Worth, Tex.

[73] Assignee: Motorola, Inc., Schaumburg, Ill.

[21] Appl. No.: 269,245

[22] Filed: Jun. 30, 1994

[51] Int. Cl.$^6$ ..................................................... H03D 3/24

[52] U.S. Cl. .......................... 375/376; 327/156; 327/159; 327/160

[58] Field of Search ...................................... 375/376, 373, 375/374, 375; 327/156, 159, 160, 105, 107; 331/14

[56] References Cited

U.S. PATENT DOCUMENTS 4,688,094  8/1987  Tanabe et al. ........................... 327/160
4,964,117  10/1990  Shier ........................................ 327/156

Primary Examiner—Stephen Chin
Assistant Examiner—Huong Luu
Attorney, Agent, or Firm—Raymond J. Warren

[57] ABSTRACT

A digital oscillator is synchronized to a master clock by comparing the master clock to an output of the digital oscillator by providing both to a first register which enables a counter. The counter increments while enabled until cleared. The output of the counter is then compared with a stored signal. Depending upon the match with the stored signal, the output of the digital oscillator is either slowed, advanced or maintained. The output from the digital oscillator is then fed back to an input of the digital phase locked loop.

13 Claims, 3 Drawing Sheets

DIGITAL PHASE LOCKED LOOP

FIELD OF THE INVENTION

The present invention relates, in general, to phase locked loops (PLLs) and, more particularly, to digital PLLs.

BACKGROUND OF THE INVENTION

In designing systems, such as cellular communication system, it is often necessary to have the various components in synchronous timing with one another. Particularly if a time based protocol is used, such as Time Division Multiplexing (TDM) or Time Division Multiple Access (TDMA). To accomplish this timing, there is typically a reference to which each of the system nodes, or base sites in a cellular communication system, are synchronized.

This synchronization can be accomplished through various techniques such as through the use of a Global Positioning System (GPS). However, because of the expense associated with such a design, more economical means are often needed. One more economical means is to have a master clock from a master node that will transmit a pulse to various slave nodes. This would then require a PLL design that can utilize the master clock signal to adjust the slaves timing.

DETAILED DESCRIPTION OF THE DRAWING

Figure 1:
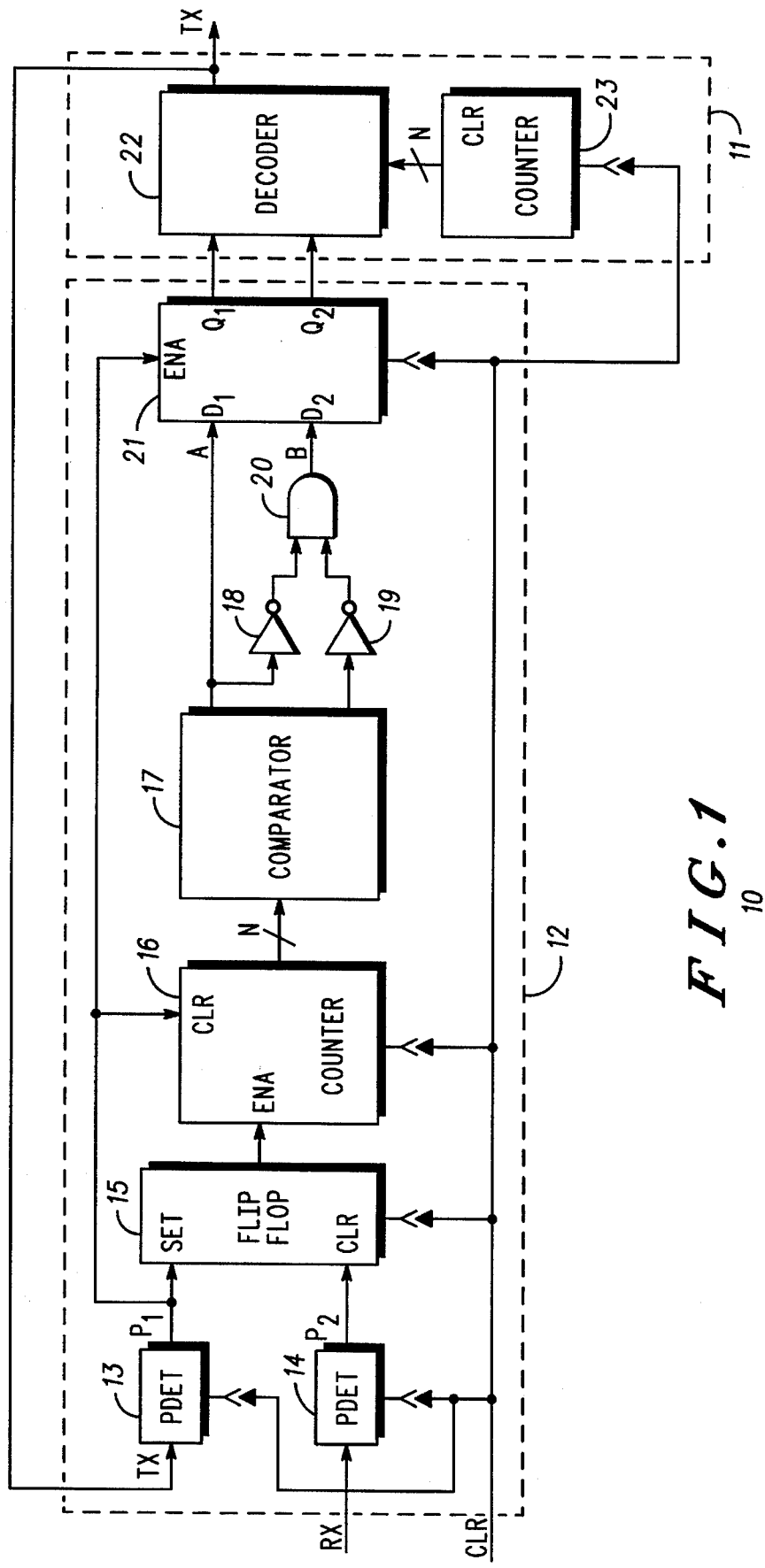
FIG. 1 a block diagram of a digital phase locked loop embodying the present invention.

Referring initially to FIG. 1, a block diagram of a digital phase locked loop, generally designated 10, is illustrated. PLL 10 consists, generally, of an oscillating means, such as oscillator 11, and a phase difference and control logic block 12. Block 12 consists of Pulse DETector (PDET) 13 which receives a feedback of the transmit TX signal, illustrated in the timing diagram of FIG. 2, generated from oscillator 11. The input of a second PDET 14 is a timing signal received from a master clock. The master clock, or reference, signal is designated RX and illustrated in FIG. 2.

Figure 2:
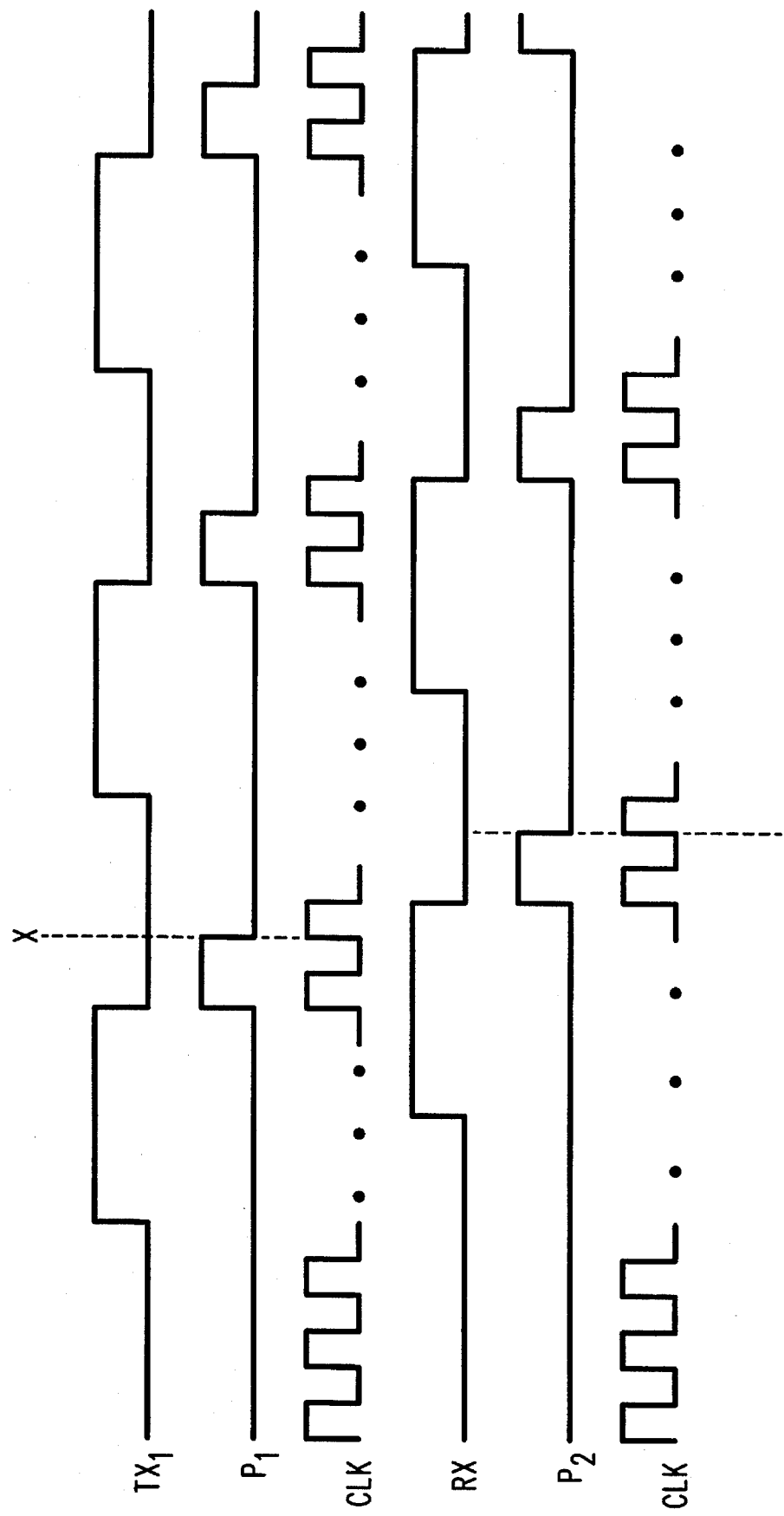
FIGS. 2 and 3 are timing diagrams representing the functioning of the digital phase locked loop of FIG. 1.

The outputs generated by PDETs 13 and 14 are illustrated by timing lines P1 and P2, respectively, of FIG. 2. Signal P1 is input to the SET input of a register means, such as a flip-flop, 15 which stores and provides a constant output until cleared or reset. The P2 signal is input to the CLR (CLeaR) input of flip-flop 15. The output of flip-flop 15 is coupled to an ENA (ENAble) input of a counting means, such as counter 16. Counter 16 also has a CLR input coupled to the output of PDET 13 and a clock input coupled to receive a clock signal. The output of counter 16 is a parallel bus coupled to a comparing means, such as comparator 17. In comparator 17, an input number received from counter 16 is compared with a preset number, or range of numbers. Depending upon the resulting comparison, a two bit output is provided from comparator 17. One bit is provided to a first inverter 18 and the other bit to a second inverter 19.

The outputs from the inverters 18 and 19 are then provided to two inputs of an AND gate 20. The output of AND gate 20 is designated B and is provided to a D2 input of a second register means, D-type flip-flop 21. The output of comparator 17, which is transmitted to inverter 18, is also provided to a D1 input of D-type flip-flop 21. D-type flip-flop 21 also has an ENA input coupled to the output of PDET 13 and a clock input coupled to the CLK input of block 12.

The outputs, Q1 and Q2, of flip-flop 21 are coupled to a decoding means, such as decoder 22, of oscillator 11. Decoder 22 provides a control output coupled to a CLR input of a counter 23. Counter 23 also has a clock input and a parallel output. The parallel output is coupled to a control input of decoder 22 and, along with the B and A inputs, is used to adjust the timing of oscillator 11. A second output of decoder is used for the timing of the slave node and is provided as feedback to PDET 13 of block 12.

In operation, a TX signal is presented to PDET 13 as illustrated in FIG. 2. At point X in the timing diagram, there is a pulse output from PDET 13 which sets flip-flop 15, clears counter 16, and enables D-type flip-flop 21 to save the BA outputs. The reference signal, RX, input is received by PDET 14 from a master node (not shown). The RX signal and resulting P2 signal from PDET 14 are illustrated in FIG. 2. At point Y, the P2 signal clears flip-flop 15 which stops counter 16. The output of counter 16 is provided to comparator 17 where it is compared to a preset number. The outputs of comparator 17 are then logically combined to provide a two bit output (B A). The possible two bit outputs, and what they represent, are illustrated below in Table A.

TABLE A

| B | A | MEANING | SHIFT |
|---|---|---------|-------|
| 0 | 1 | >2.5 ms | LEFT |
| 1 | 0 | ≦2.5 ms | RIGHT |
| 0 | 0 | = 0 ms | NONE |

This process is used to measure the time difference between X and Y.

Figure 3:
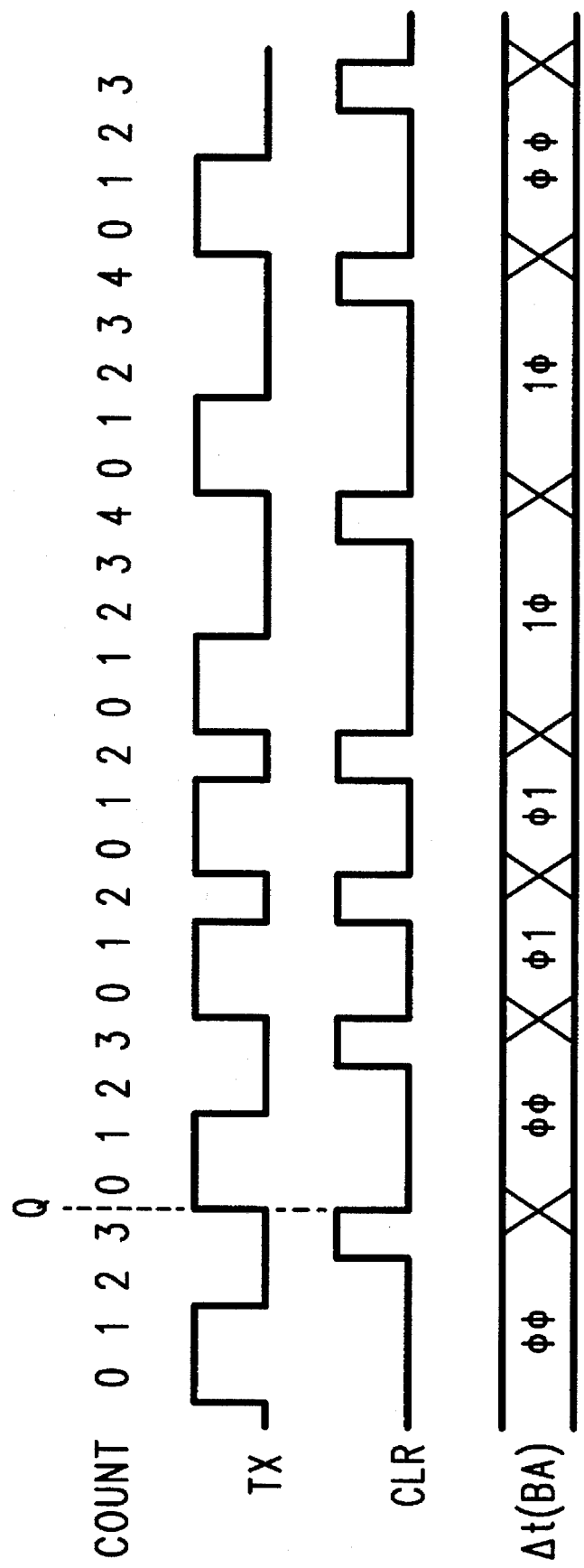

The objective here is to adjust the timing of oscillator 11 to match that of the RX input from the master node. In FIG. 3, the operation of counter 23 and comparator 17 is used to illustrate how this is accomplished. Counter 23 is cleared when its CLR goes low as represented at point Q. Counter 23 will then begin to count until reset again. In the example being provided, the normal count is represented as being four and would represent a 5 ms (millisecond) duration. However, in actual practice, the count may be set up to 1000 or more.

When B=0 and A=1 is latched into D-type flip-flop 21 the difference between the TX and RX signals is more than 2.5 ms. When this output is provided through flip-flop 21 to decoder 22, the CLR input to counter 23 will be provided early. This is illustrated in FIG. 3 where the BA bits 01 show the CLR on the third count rather than the fourth count. This causes the timing of oscillator 11 to shift left one clock.

When B=1 and A=0, the difference between the TX and RX signals is less than or equal to 2.5 ms (but not 0 ms). When this output is provided to decoder 22 through flip-flop 21, the CLR input to counter 23 will be provided late. This is shown in FIG. 3 where the BA bits 10 are present. In this case, the CLR is on the fifth count, thereby extending the TX pulse.

Finally, when B=0 and A=0, the difference between the TX and RX signals is 0 ms, or insignificant. In this case, no corrective action results and the CLR to counter 23 occurs on the fourth pulse.

While the invention has been described in conjunction with specific embodiments thereof, it is evident that many alterations, modifications, and variations will be apparent to those skilled in the art in light of the foregoing description.

Accordingly, it is intended to embrace all such alterations, modifications, and variations in the appended claims.

I claim:

1. A digital phase locked loop comprising:

first register means for storing a first input, said first register means having a first input, a second input coupled to receive a reference signal, an output, and a clock input coupled to receive a clock signal;

first counting means for counting, said first counting means having an enable input coupled to said output of said first register means, a clear input coupled to said first input of said first register means, a clock input coupled to receive said clock signal, and an output;

comparing means for comparing the output of said first counting means to a stored signal, said comparing means having an input coupled to said output of said first counting means and an output; and oscillating means for providing an oscillating output, said oscillating means having an input coupled to said output of said comparing means, a clock input coupled to receive said clock signal, and an output coupled to said first input of said first register means.

2. The digital phase locked loop of claim 1 further comprising a second register means for storing a second input, said second register means having an input coupled to said output of said comparing means, an output coupled to said input of said oscillating means, a clock input coupled to receive said clock signal, and an enable input coupled to said first input of said first register means.

3. The digital phase locked loop of claim 2 wherein said second register means comprises a D-type flip-flop.

4. The digital phase locked loop of claim 1 further comprising:

first detecting means for detecting a first pulse, said first detecting means having an input coupled to said output of said oscillating means, an output coupled to said first input of said first register means and to said clear input of said first counting means, and a clock input coupled to receive said clock signal; and second detecting means for detecting a second pulse, said second detecting means having an input coupled to receive said reference signal, and a clock input coupled to receive said clock signal.

5. The digital phase locked loop of claim 1 wherein said first register means comprises a flip-flop.

6. The digital phase locked loop of claim 1 wherein said oscillating means comprises:

decoding means for decoding a received signal, said decoding means having an input coupled to said output of said comparing means, an output coupled to said first input of said first register means and to provide an output of said digital phase locked loop, a control output, and a control input; and second counting means for counting, said second counting means having a clock input for receiving said clock signal, a clear input coupled to said control output of said decoding means, and an output coupled to said control input of said decoding means.

7. A digital phase locked loop comprising:

first detecting means for detecting a first pulse, said first detecting means having an input, an output, and a clock input coupled to receive a clock signal;

second detecting means for detecting a second pulse, said second detecting means having an input coupled to receive a reference signal, an output, and a clock input coupled to receive said clock signal;

first register means for storing an input, said first register means having a first input coupled to said output of said first detecting means, a second input coupled to said output of said second detecting means, an output, and a clock input coupled to receive said clock signal;

first counting means for counting, said first counting means having an enable input coupled to said output of said first register means, a clear input coupled to said output of said first detecting means, a clock input coupled to receive said clock signal, and an output;

comparing means for comparing the output of said first counting means to a stored signal, said comparing means having an input coupled to said output of said first counting means and an output;

second register means having an input coupled to said output of said comparing means, an output, a clock input coupled to receive said clock signal, and an enable input coupled to said output of said first detecting means; and oscillating means for providing an oscillating output, said oscillating means having an input coupled to said output of said second register means, a clock input coupled to receive said clock signal, and an output coupled to said input of said first detecting means.

8. The digital phase locked loop of claim 7 wherein said first register means comprises a flip-flop.

9. The digital phase locked loop of claim 7 wherein said second register means comprises a D-type flip-flop.

10. The digital phase locked loop of claim 7 wherein said oscillating means comprises:

decoding means for decoding a received signal, said decoding means having an input coupled to said output of said comparing means, an output coupled to said first input of said first register means and to provide an output of said digital phase locked loop, a control output, and a control input; and second counting means for counting, said second counting means having a clock input for receiving said clock signal, a clear input coupled to said control output of said decoding means, and an output coupled to said control input of said decoding means.

11. A digital phase locked loop comprising:

a first pulse detector having an input, an output, and a clock input coupled to receive a clock signal;

a second pulse detector having an input coupled to receive a reference signal, an output, and a clock input coupled to receive said clock signal;

a first flip-flop having a set input coupled to said output of said first pulse detector, a clear input coupled to said output of said second pulse detector, an output, and a clock input coupled to receive said clock signal;

a first counter having an enable input coupled to said output of said first flip-flop, a clear input coupled to said output of said first pulse detector, a clock input coupled to receive said clock signal, and an output;

a comparator having an input coupled to said output of said first counter, a first output, and a second output;

a second flip-flop having a first input coupled to said first output of said comparator, a second input coupled to said second output of said comparator, an output, a clock input coupled to receive said clock signal, and an enable input coupled to said output of said first pulse detector; and an oscillator having an input coupled to said output of said second flip-flop, a clock input coupled to receive said clock signal, and an output coupled to said input of said first pulse detector.

12. The digital phase locked loop of claim 11 wherein said oscillator comprises:

a decoder having an input coupled to said output of said comparator, an output coupled to said input of said first pulse detector and to provide an output of said digital phase locked loop, a control output, and a control input; and a second counter having a clock input for receiving said clock signal, a clear input coupled to said control output of said decoder, and an output coupled to said control input of said decoder.

13. The digital phase locked loop of claim 11 further comprising:

a first inverter having an input coupled to said first output of said comparator and an output;

a second inverter having an input coupled to said second output of said comparator and an output; and a logic gate having a first input coupled to said output of said first inverter, a second input coupled to said output of said second inverter, and an output coupled to said second input of said second flip-flop.

\* \* \* \* \*